United States Patent [19]

Asplund

[11] Patent Number: 5,115,201
[45] Date of Patent: May 19, 1992

[54] DIGITAL DEMODULATOR
[75] Inventor: Mark D. Asplund, Olathe, Kans.
[73] Assignee: Allied-Signal Inc., Morris Township, Morris County, N.J.
[21] Appl. No.: 628,266
[22] Filed: Dec. 17, 1990
[51] Int. Cl.⁵ .................. H03D 1/00; G01C 21/18
[52] U.S. Cl. ............................ 329/356; 364/453
[58] Field of Search ............. 329/356; 332/118, 150; 364/556, 559, 729, 730, 443, 453, 454

[56] References Cited

U.S. PATENT DOCUMENTS 3,482,309 12/1969 Bouchard .................. 332/150 X
3,909,599 9/1975 Trott, Jr. et al. ............ 329/343 X

*Primary Examiner*—David Mis
*Attorney, Agent, or Firm*—Donald B. Paschburg; Howard G. Massung; Robert A. Walsh

[57] ABSTRACT

A digital demodulator utilizes voltage to frequency converters, digital counters and a computer to combine demodulation and analog to digital conversion into one step, therefore providing for in-phase and quadrature demodulation of amplitude modulated double sideband suppressed carrier signals. Accleration sinusoidal signals and phase reference pulses are input to a voltage to frequency converter and counter board which interfaces to a computer where the signals are demodulated using a digital demodulation scheme.

16 Claims, 8 Drawing Sheets

SETUP: Vin = cos(wt)

| TEST # | VOLTS DC | VOLTS AC | COS | SINE |
|---|---|---|---|---|
| 1 | -0.0148 | 0.01113 | 23.844 | 2.316 |
| 2 | -0.0148 | 0.05104 | 110.234 | 7.272 |
| 3 | -0.0148 | 0.10624 | 229.583 | 14.263 |
| 4 | -0.0148 | 0.25322 | 547.783 | 32.581 |
| 5 | -0.0148 | 0.50412 | 1090.098 | 64.286 |
| 6 | -0.0148 | 1.00895 | 2180.664 | 128.296 |
| 7 | -0.0148 | 2.5531 | 5520.788 | 323.716 |
| 8 | -0.0148 | 2.5926 | 5606.179 | 331.395 |

*FIG. 4*

SETUP: Vin = sin(wt)

| TEST # | VOLTS DC | VOLTS AC | COS | SINE |
|---|---|---|---|---|
| 1 | -0.0148 | 0.00066 | -0.382 | 0.702 |
| 2 | -0.0148 | 0.01175 | 1.319 | 26.049 |
| 3 | -0.0148 | 0.05047 | 6.882 | 108.886 |
| 4 | -0.0148 | 0.10903 | 14.809 | 234.417 |
| 5 | -0.0148 | 0.25752 | 23.004 | 552.980 |
| 6 | -0.0148 | 0.54311 | 58.434 | 1036.426 |
| 7 | -0.0148 | 1.05595 | 130.765 | 2262.793 |
| 8 | -0.0148 | 2.0305 | 250.226 | 4352.810 |
| 9 | -0.0418 | 2.5160 | 304.720 | 5392.974 |

*FIG. 5*

SETUP: Vin = −cos (wt)

| TEST # | VOLTS DC | VOLTS AC | COS | SINE |
|---|---|---|---|---|
| 1 | −0.0148 | 0.00068 | 0.269 | 0.759 |
| 2 | −0.0148 | 0.00106 | −2.218 | 0.0722 |
| 3 | −0.0148 | 0.00255 | −5.69300 | 1.083 |
| 4 | −0.0148 | 0.00528 | −11.7370 | 1.241 |
| 5 | −0.0148 | 0.01083 | −23.7010 | 1.815 |
| 6 | −0.0148 | 0.02587 | −56.417 | 3.293 |
| 7 | −0.0148 | 0.05093 | −110.519 | 5.757 |
| 8 | −0.0148 | 0.10419 | −225.494 | 10.606 |
| 9 | −0.0148 | 0.25070 | −542.377 | 24.079 |
| 10 | −0.0148 | 0.50609 | −1094.11 | 50.994 |
| 11 | −0.0148 | 1.00821 | −2178.076 | 100.060 |
| 12 | −0.0148 | 1.38685 | −2995.262 | 137.010 |
| 13 | −0.0148 | 2.0012 | −4324.673 | 197.285 |
| 14 | −0.0148 | 2.7550 | −5951.436 | 274.63 |

| TEST # | VIN | VOLTS DC | VOLTS AC | COS | SINE |
|---|---|---|---|---|---|
| 1 | SIN(WT + 29.00°) | -0.0148 | 2.0635 | 2142.194 | 3902.748 |
| 2 | SIN(WT - 29.67°) | -0.0148 | 2.0662 | -2038.333 | 3960.381 |
| 3 | SIN(WT - 45.50°) | -0.0148 | 2.0726 | -3131.325 | 3202.531 |

FIG. 9

SETUP: Vin = sin(wt - 45.5°)

| TEST # | VOLTS DC | VOLTS AC | COS | SINE |
|---|---|---|---|---|
| 1 | +2.0385 | 1.13125 | -1703.827 | 1746.443 |
| 2 | -0.095 | 1.13220 | -1707.220 | 1751.45 |
| 3 | -2.245 | 1.13102 | -1706.566 | 1751.652 |
| 4 | -2.2592 | 1.13076 | -1706.610 | 1751.036 |

FIG. 10

SETUP: Vin = sin(wt - 45.5°)

| TEST # | # SAMPLES / MEAN | VOLTS DC | VOLTS AC | COS | SINE |
|---|---|---|---|---|---|
| 1 | 100 | -2.2592 | 1.12076 | -1705.270 | 1750.71 |
| 2 | 5000 | -2.2592 | 1.13076 | -1706.610 | 1751.036 |
| 3 | 1000 | -2.2592 | 1.13076 | -1706.610 | 1751.036 |
| 4 | 20,000 | 2.2579 | 1.13065 | -1705.976 | 1751.287 |

DIGITAL DEMODULATOR

BACKGROUND OF THE INVENTION

1. Field of the Invention

The present invention is related to amplitude modulated carrier signals and more specifically to the demodulation of these signals.

2. Description of the Prior Art

The well-known process of using amplitude modulation to recover a baseband signal is the usual method utilized to recover modulated information such as gyroscopic output information. The demodulation of sensor signals can be extended to include quadrature detection demodulation so as to output the sine and cosine components as referenced to the case coordinate system of the sensor.

There are several prior art techniques available for performing in-phase and quadrature demodulation of an amplitude modulated double sideband suppressed carrier signal. The requirement exists, however, for an apparatus that not only addresses the need to demodulate a sinusoidal signal, but also the need to convert this demodulated signal into digital format. All of the prior art techniques, however, require analog circuitry to perform the demodulation process and then separately, the demodulated signal is digitized with an analog to digital converter.

Analog circuits are subject to many error sources including temperature sensitivity, noise, and induced error voltages from EMI. These error sources can be addressed in traditional ways, but in applications that have a small scale factor of the output signals, any additional noise presents major problems and such sources must be carefully scrutinized.

Temperature compensation can be performed to minimize temperature related errors such as bias drifts but any compensation requires knowledge of the system that is often acquired from empirical testing Such testing is time consuming and therefore expensive.

Noise encountered in analog circuits can generally be classified into a few specific categories such as Johnson noise, flicker or 1/f noise, shot (or Schottky) noise or popcorn noise. The error contribution of each type of noise must be studied and weighed to determine a correct method of reduction. This analysis adds cost and time delays to the final product.

The requirement still exists for an accurate yet inexpensive method for demodulation of a sinusoidal signal into in-phase and quadrature components digital data.

SUMMARY OF THE INVENTION

In accordance with the present invention an amplitude modulated double sideband suppressed carrier signal containing unknown amplitude and phase information for in-phase and quadrature components is demodulated. This invention uses voltage to frequency converters, digital counters and a computer to combine the demodulation and analog to digital converter (ADC) process into one step thus providing for a simpler and less costly method of demodulation.

BRIEF DESCRIPTION OF THE DRAWINGS

FIG. 4 illustrates Group 1 data samples.

FIG. 5 illustrates Group 2 data samples.

FIG. 7 illustrates Group 3 data samples.

FIG. 8 illustrates Group 4 data samples.

FIG. 9 illustrates Group 5 data samples.

FIG. 10 illustrates Group 6 data samples.

DETAILED DESCRIPTION OF THE INVENTION

The present invention is a digital in-phase and quadrature demodulator. Embodiments of this invention can be used in a wide variety of applications where sinusoidal signals containing unknown amplitude and phase information are desired to be demodulated. For purposes of this discussion, an application involving an acceleration sensor, having one output sinusoidal signal, will be used to illustrate one embodiment of the present invention.

Figure 1:
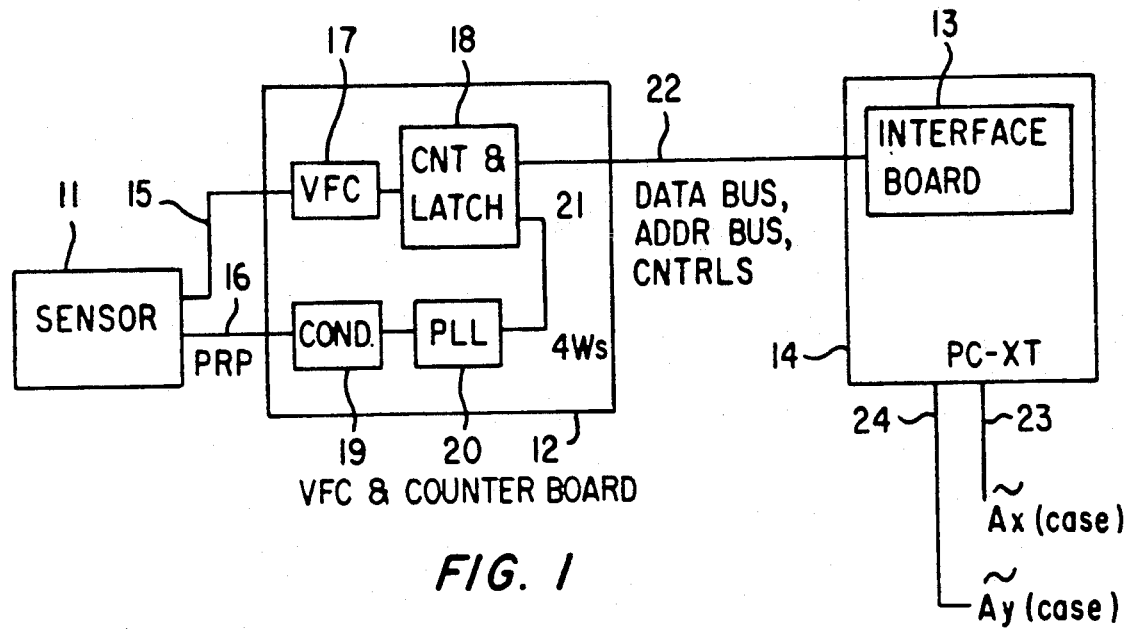
FIG. 1 illustrates a hardware block diagram of the present invention.

FIG. 1 illustrates sensor 11, VFC and counter board 12 and interface board 13 residing within computer 14. A PC-XT will be used as the computer for this discussion. As can be seen, sensor 11 is outputting 2 signals, an acceleration sinusoidal signal (VI) 15 and a phase reference pulse (PRP) 16. These signals are input to VFC and counter board 12 and then to computer 14 where they are demodulated using a digital demodulation scheme. The following is a description of the signals that are output from sensor 11 and an overview of the digital demodulation process of the present invention.

As stated above, the outputs of sensor 11 consist of one acceleration sinusoidal signal 15 and one phase reference pulse 16. The acceleration signal is a sinusoidal wave whose amplitude is proportional to the applied external specific force of acceleration and whose phase is related to the position of the input acceleration vector to a fixed point on the case of the unit. The frequency of the sinusoidal is the spin frequency of the rotating sensing platform. A spin frequency of 50 HZ will be used for this example. The PRP 16 is an analog pulse that is output by sensor 11 one time per revolution of the rotating head assembly. The purpose of this pulse is to indicate the phase position of the rotating platform with respect to a fixed position on the case of the sensor.

The purpose of the present invention is to implement a digital demodulation scheme to measure the amplitude and phase of the sinusoidal signal. The approach to be taken to perform this demodulation process is to convert the acceleration sinusoidal signal 15 into digital pulses which are accumulated by digital counters. The phase reference pulse 16 is used to enable counter and latch 18 to latch the state of the counters at specific times and to inform the computer 14 to sample the state of the counters. By sampling the state of the counters at these appropriate times, software is able to measure the input sinusoidal signals. The amplitude is then directly proportional to the magnitude of the acceleration being experienced by sensor 11.

The mathematical representation of the acceleration sinusoidal signal (VI) 15 that is output from the sensor is as follows:

$$VI = Ax\, \cos(Ws*t) + Ay\, \sin(Ws*t)$$

Where Ax and Ay are the input specific forces of acceleration as referenced to the sensor's case and Ws is the spin frequency of the rotating elements of the sensor. Although this technique will work for a wide range of Ws frequencies, Ws will be assumed to be 50 Hz for the discussion of this embodiment of the invention.

This signal is then sent through the demodulator where it is resolved into the x case 23 and y case 24 coordinate systems i.e. the in-phase and quadrature components. The mathematical expression of the signal which is output from the demodulator is as follows:

$$\tilde{V}x(case) = Ax \cos(Ws^*t)$$

$$\tilde{V}y(case) = Ay \sin(Ws^*t)$$

The ~ symbol indicates that this is a measurement.

This demodulation, in part, is implemented digitally by integrating (counting) the pulses from the voltage to frequency converter (VFC) 17. This count information is accumulated in four subcounts for each 50 Hz cycle. Assume for the moment that the incoming voltage is represented by "sin (Ws*t)". The counter is cleared out at the beginning of the 50 Hz sinusoid and the count is read as the waveform passes through the 90 degree position. This constitutes the first subcount. Subcounts are acquired for the 90 to 180, 180 to 270, and 270 to 360 degree positions. These 4 subcounts are named A1, A2, A3 and A4 respectively.

Figure 2:
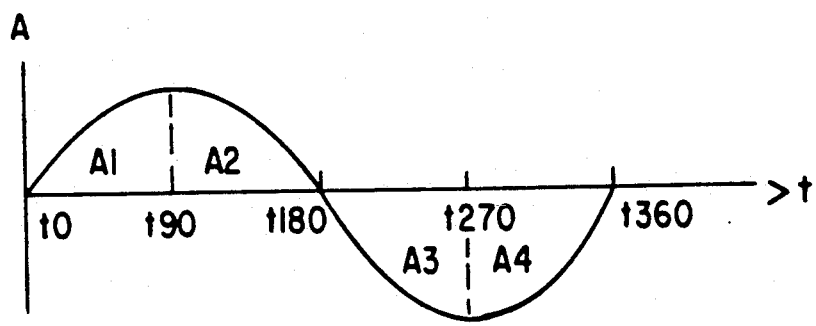
FIG. 2 illustrates a sine waveform.

Using the calculus integral operation, A1 is the integral of V1 over the interval from 0 to 90 degrees. Therefore Aj is the delta count information as computed by reading the count at the t0 point and again at the t90 point. Then A1 equals the count at t90 minus the count at t0. So for the sine wave as shown in FIG. 2:

$$\sin(Ws^*t) = A1 + A2 - A3 - A4$$

and likewise for a cosine wave $$\cos(Ws^*t) = A1 - A2 - A3 + A4$$

and so the complete demodulated outputs from the computer are:

$$\tilde{Ax}(case) = (A1 - A2 - A3 + A4)$$

$$\tilde{Ay}(case) = (A1 + A2 - A3 - A4)$$

The phase reference pulse is output one time per revolution of the rotating platform and therefore can be used to reference the phase of the output signals. This pulse is always lined up with the X case axis of the sensor and so this pulse is lined up with the peak amplitude of the Ax*cos(Ws*t) waveform.

Figure 3:
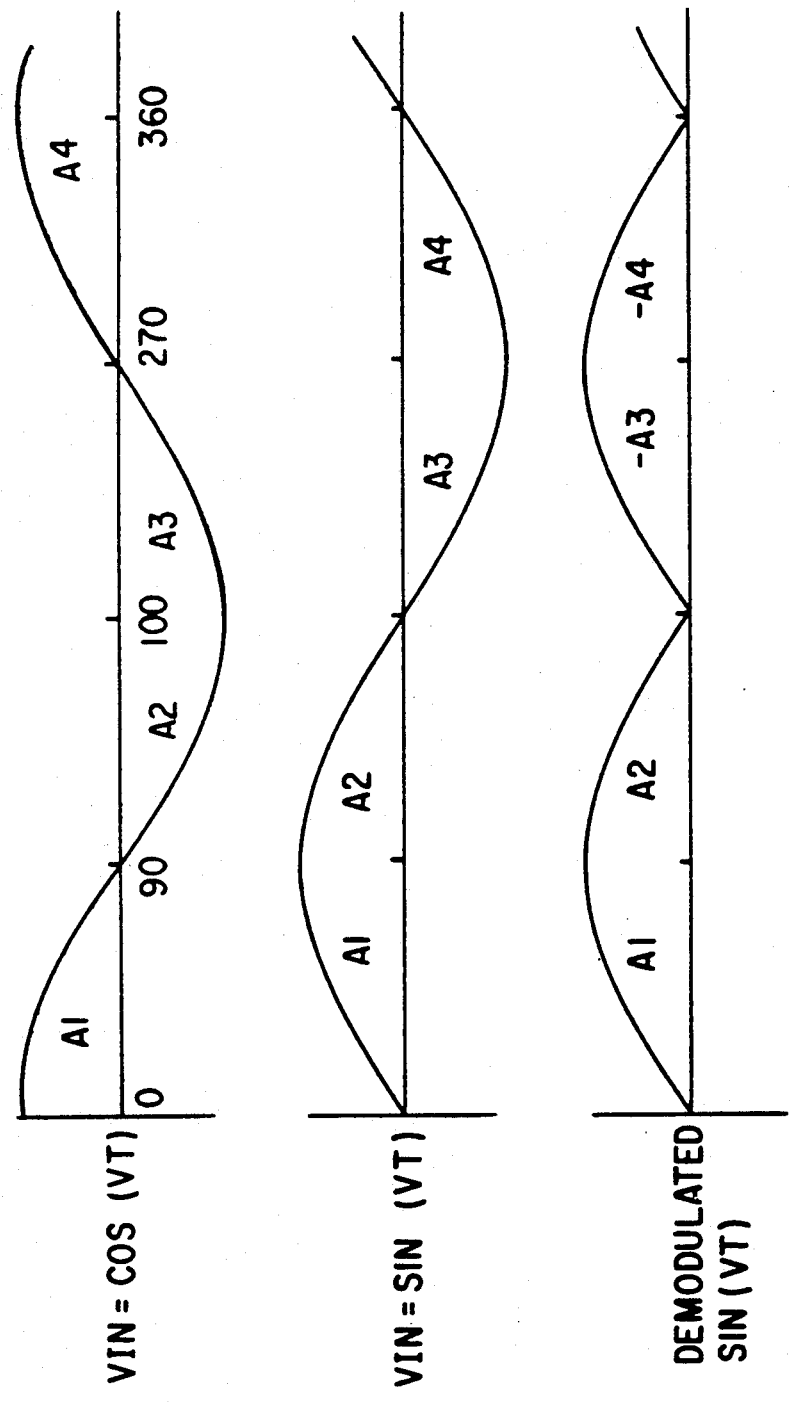
FIG. 3 illustrates a multisensor counter timing diagram.
Figure 3:
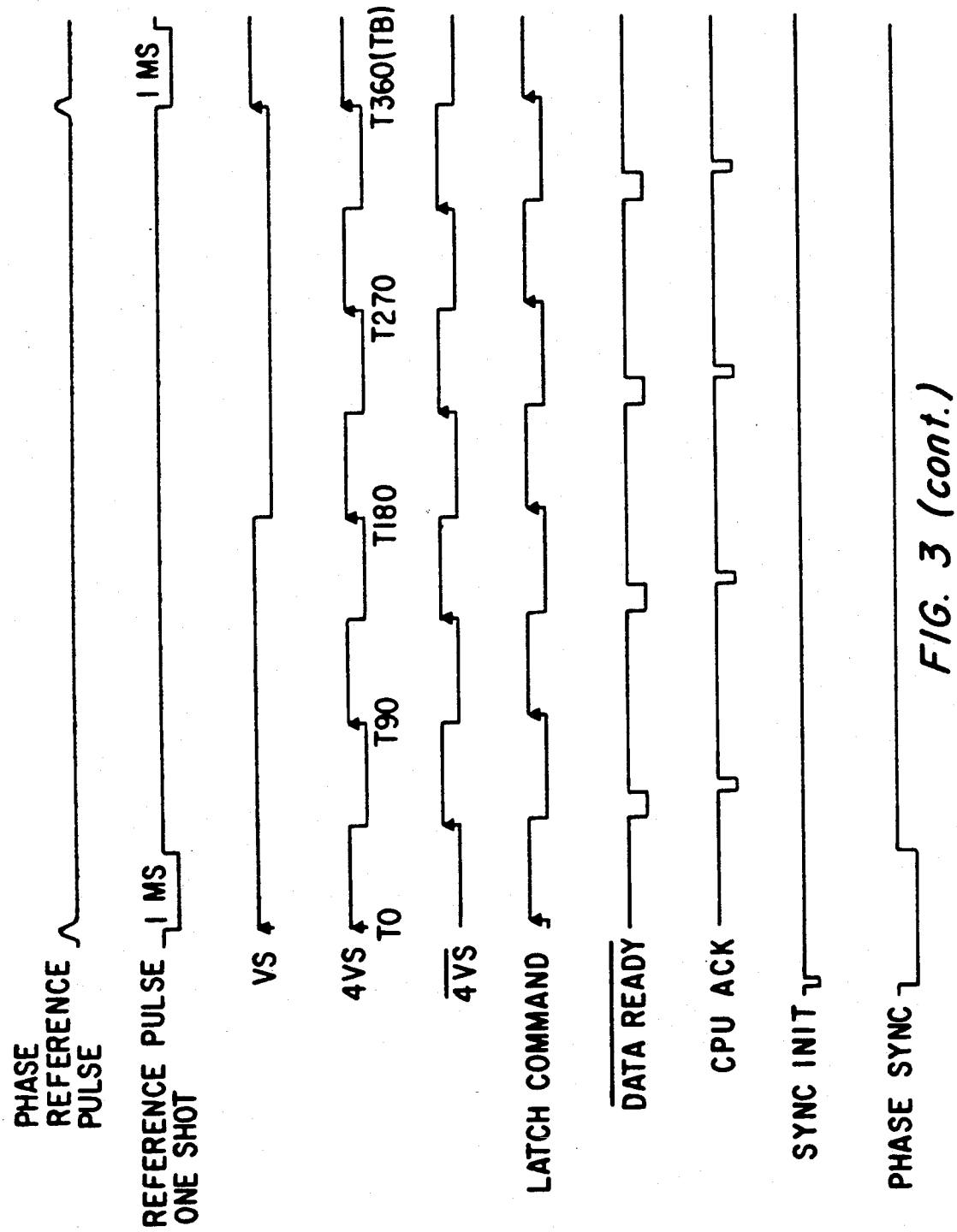

FIG. 3 illustrates the relationship of the various timing signals. The PRP is output from the sensor and indicates the position of the spinning platform which contains the transducer elements. This small amplitude analog signal is run into a signal conditioner (19 of FIG. 1) which first uses a rate deriver to calculate the rate of change of the input signal. This derived signal is then passed to a comparator also within signal conditioner (19 of FIG. 1) that fires at a reference voltage, generating a sharp clock edge at the center of the PRP. This digitized version of the PRP which occurs at the spin frequency (Ws), is run into a Phase Locked Loop (PLL) (20 of FIG. 1) that is set up to generate a square wave clock (4 Ws) which is four times the frequency of the PRP. This 4 Ws pulse (21 of FIG. 1) is used to latch the contents of the counters at the 0, 90, 180, and 270 degree points of the input sinusoidal waveform.

The sinusoidal acceleration information is directed to a voltage to frequency converter (VFC) which outputs digital pulse trains proportional to the amplitude of that sine wave. These VFC's output a digital pulse train whose frequency is proportional to the amplitude of the input voltage. The VFC's are setup to output a frequency of about 900 KHZ when the input voltage is at +5 VDC, 500 Khz when the input voltage is at 0.0 VDC and about 100 KHZ for an input voltage of −5 VDC. Therefore when a sinusoidal wave that swings to +5 Vpeak to −5 Vpeak and is centered around zero volts is input to the VFC, the output looks like an FM signal. The digital pulses that are output are a 0 to +5 VDC pulse of 400 ns duration.

As indicated in FIG. 1 the VFC pulse trains are run into counter and latch 18 which has synchronous counters that accumulate the number of pulses occurring in a given time interval determined by the 4 Ws signal described above. At the rising edge of the 4 Ws signal a latch command is generated by a latch synchronization circuit within counter and latch 18 to store the present count in the latches. When the 4 Ws pulse latches the count it also sets certain bits in a status word. A polling scheme is employed whereby the computer tests this bit to know when to read the count data.

FIG. 3 illustrates the timing relationship of the various signals involved in generation of the latch command. The latching process is initiated by each rising edge of the 4 Ws data pulses. Since the VFC pulses and the PRP are asynchronous to each other, care must be taken to synchronize the latching of the data and the occurrence of a sensor data pulse so that the counters are given sufficient time to settle at the new count before their output is stored in the latches.

The accumulators, that is the digital counters, actually perform an integration of the input signal and by integrating over the correct Periods the sine and cosine information of the demodulation scheme can be derived. In order to determine the phase relationships of the input accelerations, the computer must read the accumulated pulses synchronously. Computer and accumulator synchronization is achieved by the Ws signal in conjunction with a computer issued synchronization reset. This allows the computer to know the start and end of a complete revolution of the spinning elements in the sensor.

The hardware used to interface the VFC 17 and counter and latch 18 to the computer 14 over the data bus, address bus and control lines 22 is located on an interface board 13 which resides in a prototype slot of the PC-XT. Standard buffers and discrete logic gates exist on interface board 13.

The following will describe the software organization of this preferred embodiment. The algorithm is implemented by a program called "IDHSOD". This stands for Integer Demod Heap Statistics Optionally store to Disk. This program reads the counter data at the appropriate times, and calculates the demodulation data. After the data collection process is accomplished the statistical mean and standard deviation of all the data is computed. As a user option, the data accumulated from the complete run which is accumulated in RAM can be stored in a disk.

Since, in this embodiment, the sensor is spinning at 50 Hz, the computer needs to read data 4 times per revolution. This means the computer must take a reading at a 200 hz rate (5 ms). The maximum VFC output frequency is about 900 KHZ so the maximum count that could be accumulated in a 200 HZ period is 900 KHZ/200 Hz=4500 or about 4096 (12 bits). This allows integer arithmetic to be used in many of the computations. The program flow for this IDHSOD program is described by way of the following pseudo code.

IDHSOD PSUDOCODE:
begin
  initialize the screen;
  determine the amount of data to be collected;
  display free memory available in RAM;
  initialize all data variables;
  display beginning system time;
  synchronize hardware and software to the sensor;
  pulse done calc; (* for code timing only); repeat
    synchronize HW/SW
    get a batch of data;
    add a record to RAM;
  until all batches of data have been collected;
  display system time;
  calculate the statistics;
  optionally display the heap to the screen;
  optionally store the RAM contents to the disk;
  display free memory available in RAM; end IDHSOD;

The sets of data illustrated in the figures were taken by inputting a sinusoidal voltage at a specified phase, with respect to a phase reference pulse, into the VFC and counter board. For testing groups 1 to 4, each reading is the statistical mean of 1000 readings.

Figure 6:
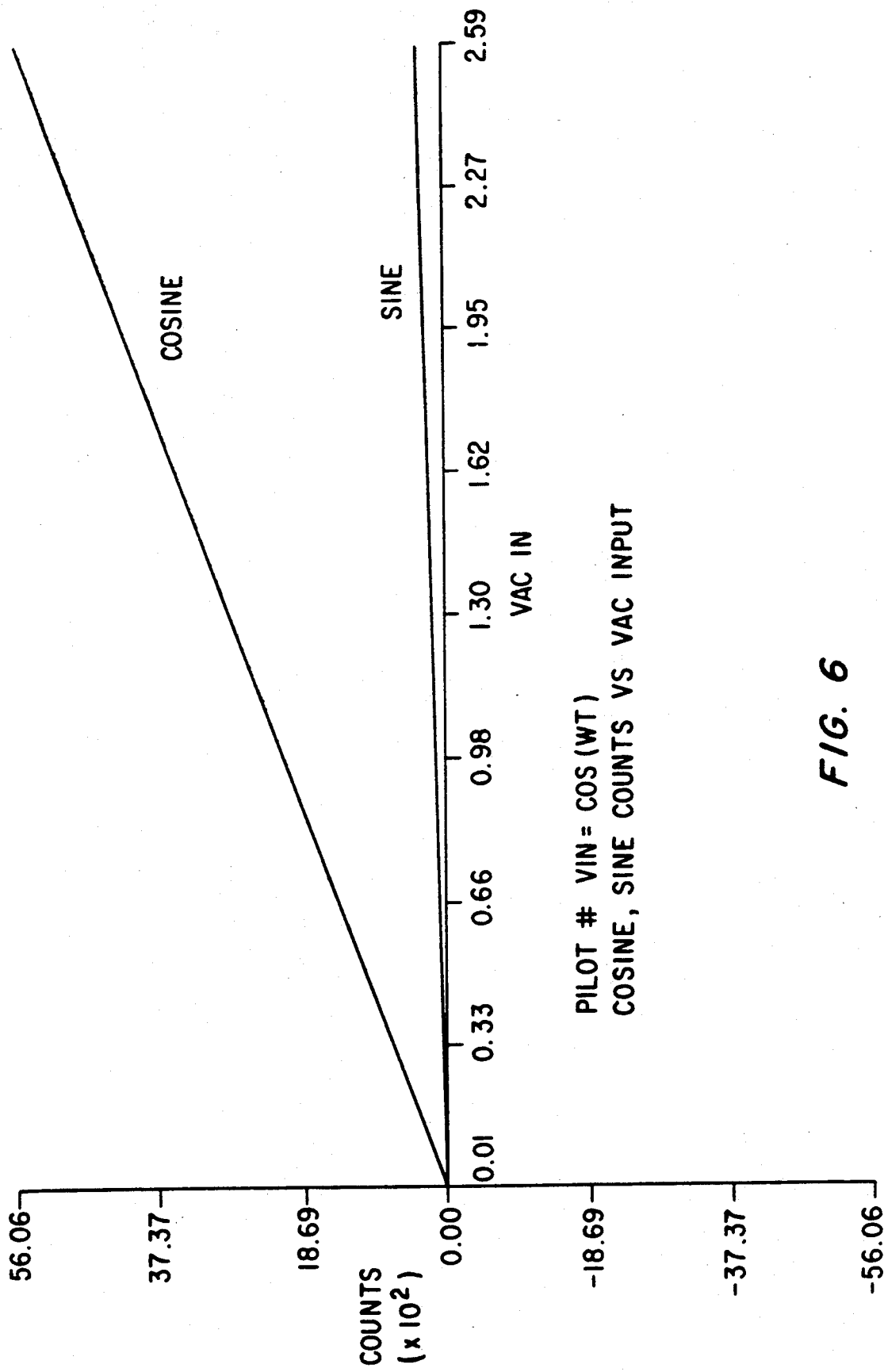
FIG. 6 illustrates cosine, sine counts versus VAC input for VIN=COS (WT).

The Group 1 data as shown in FIG. 4 illustrates the basic functionality of the invention. A plot of the group 1 data as shown in FIG. 6 illustrates that the data measurement of voltage is quite linear. Also note that the data is not purely cosine but has some small component of a sine wave. The actual misalignment phase angle is constant for all readings in the set and calculates out to be about:

$$\begin{aligned} a &= \arctan(\text{sin\_counts}/\text{cosine\_counts}) \\ &= \arctan(331.395/5606.179) \\ &= 3.38° \end{aligned}$$

Group 2 data as shown in FIG. 5, as opposed to Group 1 data, inputs a sine wave. Note that the counts of the sine are now much larger than the cosine but again there is some small pickup on the cosine axis.

Figure 11:
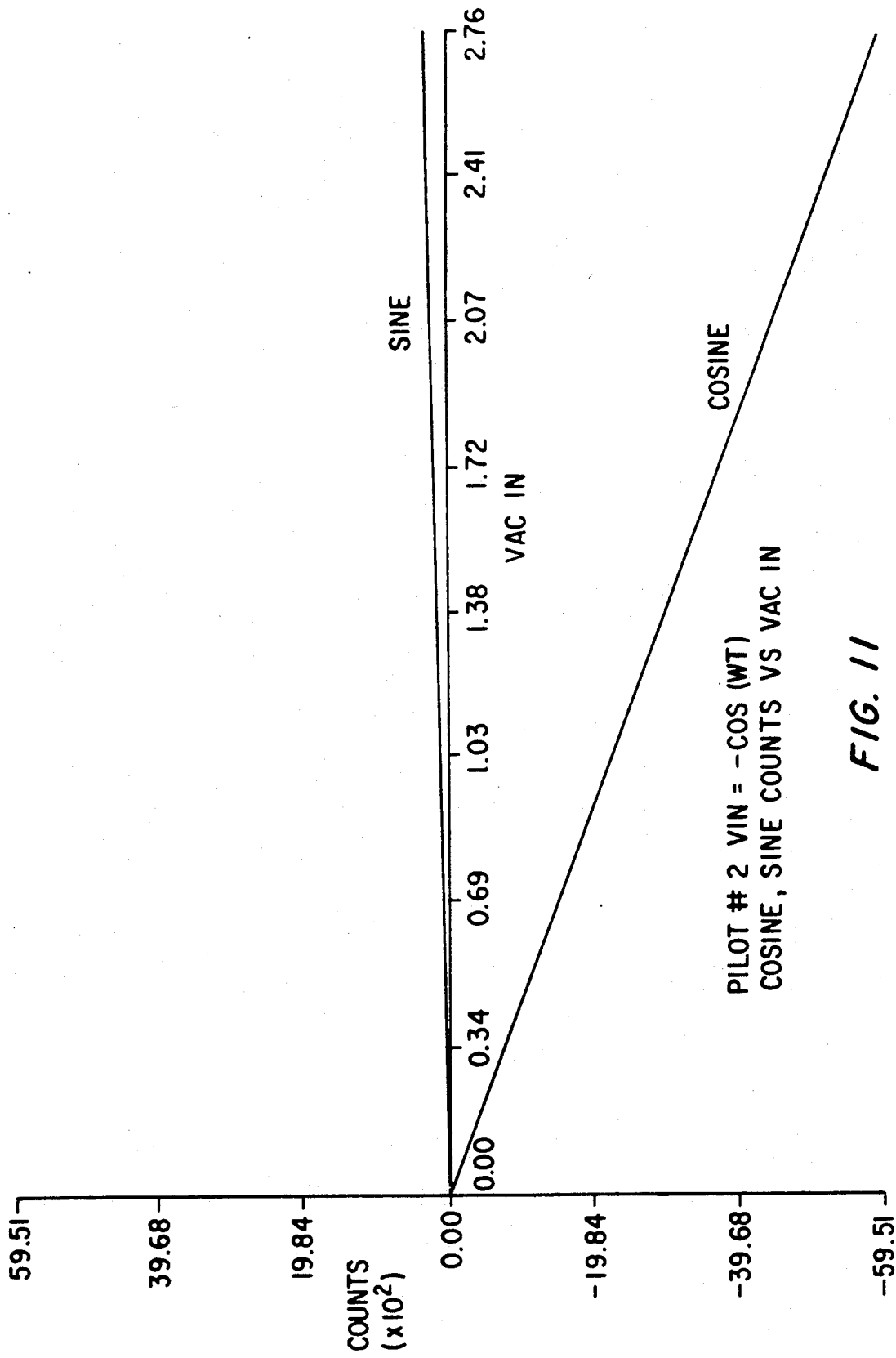
FIG. 11 illustrates cosine, sine counts versus VAC input for VIN=-COS (WT).

Group 3 data as shown in FIG. 7 is similar to Group 1 data and is presented to show the ability to detect the inversion of the cosine wave. Plot 2 as shown in FIG. 11 is a plot of this data group.

Group 4 data as shown in FIG. 8 illustrates the ability of the demodulator of the present invention to accurately measure signals with varying phase angles.

Group 5 data as shown in FIG. 9 illustrates the ability of the demodulator of the present invention to extract data in the presence of various DC offsets. One major benefit of working with AC signals is their insensitivity to DC voltage offsets. Notice that performance in this area is quite good.

Group 6 data as shown in FIG. 10 demonstrates the convergence of the data for various sized data population samples with a constant input voltage.

Plots 1 and 2 as shown in FIGS. 6 and 11 indicate that the measurement technique is linear. The scale factor of the conversion scheme works out to be:

$$\begin{aligned} SF &= X\_\text{counts}/V\_\text{in}\_\text{rms} \\ &= 2,162,377 \text{ counts per Volt RMS} \end{aligned}$$

The LSB weighting is 462 micro volts per LSB of count.

This technique can be used in all applications where a requirement exists to Perform in-phase and quadrature demodulation of a sinusoidal signal to determine the amplitude and phase of two orthogonal sets of input signals. This technique can reduce the cost, weight, and volume of the apparatus required to perform this demodulation and digitization process. An example of this invention would be sensors that output measured body rates or accelerations in the form of sinusoidal data.

It is not intended that this invention be limited to the hardware or software arrangement, or operational procedures shown disclosed. This invention includes all of the alterations and variations thereto as encompassed within the scope of the claims as follows.

I claim:

1. A digital demodulator comprising:
    VFC (voltage to frequency converter) and counter board means that receives acceleration sinusoidal signals and phase reference pulses, performs analog to digital conversion and provides digitized output information; and,
    computer means connected to said VFC and counter board means that receives said digitized output information from said VFC and counter board means, performs processing, and provides demodulated outputs therefore combining demodulation and analog to digital conversion into one step.

2. A digital demodulator as claimed in claim 1 further comprising:
    sensor means for providing said acceleration sinusoidal signals and said phase reference pulses.

3. A digital demodulator as claimed in claim 1 wherein said VFC and counter board means comprises:
    voltage to frequency converter means which receives said acceleration sinusoidal signals and outputs digital pulse trains;
    counter and latch means, having counters and latches, which receives said digital pulse trains from said voltage to frequency converter means, performs continuous integration of said digital pulse trains, accumulates a number of pulses occurring in a given time interval and stores a present count in said latches of said counter and latch means;
    signal conditioner means which receives said phase reference pulses and outputs digitized phase reference pulses (PRP's); and,
    phase locked loop means which receives said digitized PRP's and generates signals which are used to latch said counters of said counter and latch means.

4. A digital demodulator as claimed in claim 3 wherein said voltage to frequency converter means outputs said digital pulse trains at a rate proportional to amplitude of said acceleration sinusoidal signals.

5. A digital demodulator as claimed in claim 3 wherein said voltage to frequency converter means outputs said digital pulse trains at a frequency of about 900 KHZ when an input voltage is at +5 VDC and outputs said digital pulse trains at a frequency of about 100 KHZ when an input voltage is at −5 VDC.

6. A digital demodulator as claimed in claim 3 wherein said voltage to frequency converter means outputs said digital pulse trains having a voltage of 0 to +5 VDC and a pulse of 400 ns duration.

7. A digital demodulator as claimed in claim 3 wherein said counter and latch means accumulates a number of pulses occurring in a given time interval determined by a 4 Ws signal where Ws is spin frequency of a rotating element that generates said acceleration sinusoidal signals and said phase reference pulses.

8. A digital demodulator as claimed in claim 3 wherein said counters of said counter and latch means Perform integration of said digital pulse trains from said voltage to frequency converter means.

9. A digital demodulator as claimed in claim 3 wherein said signals generated by said phase locked loop means are square wave clock signals.

10. A digital demodulator as claimed in claim 9 wherein said square wave clock signals are four times frequency of said digitized PRP's.

11. A digital demodulator as claimed in claim 1 wherein said computer means is connected to said VFC and counter board means by a data bus, address bus and control lines.

12. A digital demodulator as claimed in claim 1 wherein said computer means comprises:
an interface board comprising standard buffers and discrete logic gates.

13. A digital demodulator as claimed in claim 1 wherein said computer means performs processing which determines phase relationships of said acceleration sinusoidal signals by reading accumulated pulses from said VFC and counter board means.

14. A digital demodulator as claimed in claim 1 wherein said VFC and counter board means comprises:

voltage to frequency converter means which receives said acceleration sinusoidal signals and outputs digital pulse trains; and counter and latch means, having counters and latches, which receives said digital pulse trains from said voltage to frequency converter means and performs continuous integration of said digital pulse trains.

15. A method of performing digital demodulation comprising the steps of:
receiving acceleration sinusoidal signals from a rotating element of a sensor;
receiving phase reference pulses from said rotating element of said sensor;
processing and digitizing said acceleration sinusoidal signals and said phase reference pulses in voltage to frequency converter and counter board means and computer means therefore combining demodulation and analog to digital conversion; and,
providing demodulated outputs.

16. A method of performing digital demodulation comprising the steps of:
receiving acceleration sinusoidal signals from a rotating element of a sensor;
receiving phase reference pulses from said rotating element of said sensor;
converting said acceleration sinusoidal signals into digital pulse trains in voltage to frequency converter and counter board means;
accumulating said digital pulse trains in counters of said voltage to frequency converter and counter board means;
interfacing said voltage to frequency converter and counter board means with computer means;
sampling said counters by said computer means;
performing processing in said computer means; and,
providing demodulated outputs from said computer means.

* * * * *